US006950478B1

(12) United States Patent
Rothenberg

(10) Patent No.: US 6,950,478 B1
(45) Date of Patent: Sep. 27, 2005

(54) TRANSMITTER AND METHOD HAVING A LOW SAMPLING FREQUENCY FOR DIGITAL TO ANALOG CONVERSION

(75) Inventor: Bret Rothenberg, Los Altos, CA (US)

(73) Assignee: Texas Instruments Incorporated, Dallas, TX (US)

( * ) Notice: Subject to any disclaimer, the term of this patent is extended or adjusted under 35 U.S.C. 154(b) by 798 days.

(21) Appl. No.: 09/920,881

(22) Filed: Aug. 2, 2001

(51) Int. Cl.[7] ............................................. H04L 27/12
(52) U.S. Cl. ....................................... 375/295; 455/91
(58) Field of Search ........................... 375/296, 295, 375/216, 307, 303, 302; 455/63.1, 114.2, 455/39, 65, 67.11, 67.13, 91; 370/464, 480, 370/482, 537, 540

(56) References Cited

U.S. PATENT DOCUMENTS

| | | | | |
|---|---|---|---|---|
| 3,878,525 A | * | 4/1975 | Alpers | 342/109 |
| 3,996,529 A | * | 12/1976 | Curtice | 331/99 |
| 5,745,523 A | * | 4/1998 | Dent et al. | 375/216 |
| 5,960,364 A | * | 9/1999 | Dent | 455/552.1 |
| 6,373,883 B1 | * | 4/2002 | Soerensen et al. | 375/216 |
| 6,640,091 B1 | * | 10/2003 | Shiraishi | 455/118 |
| 2002/0039889 A1 | * | 4/2002 | Boos | 455/77 |

* cited by examiner

Primary Examiner—Tesfaldet Bocure
Assistant Examiner—Pankaj Kumar
(74) Attorney, Agent, or Firm—Abdul Zindani; W. James Brady, III; Frederick J. Telecky, Jr.

(57) ABSTRACT

An apparatus and a method having a low sampling clock frequency for converting a digital signal having IF frequency channels to an analog IF signal. A DAC uses the sampling signal for converting the digital signal to the analog IF signal. A high-low RFLO signal generator generates an RFLO signal that is controlled to switch between a first RFLO frequency below a desired RF frequency band and a second RFLO frequency above the desired RF frequency band. The RF upconverter uses the first RFLO frequency for upconverting IF frequency channels into RF frequency channels in the lower half of the RF frequency band and uses the second RFLO frequency for upconverting the same IF frequency channels into different RF frequency channels in the upper half of the RF frequency band, thereby enabling the DAC to use a lower frequency sampling signal.

8 Claims, 5 Drawing Sheets

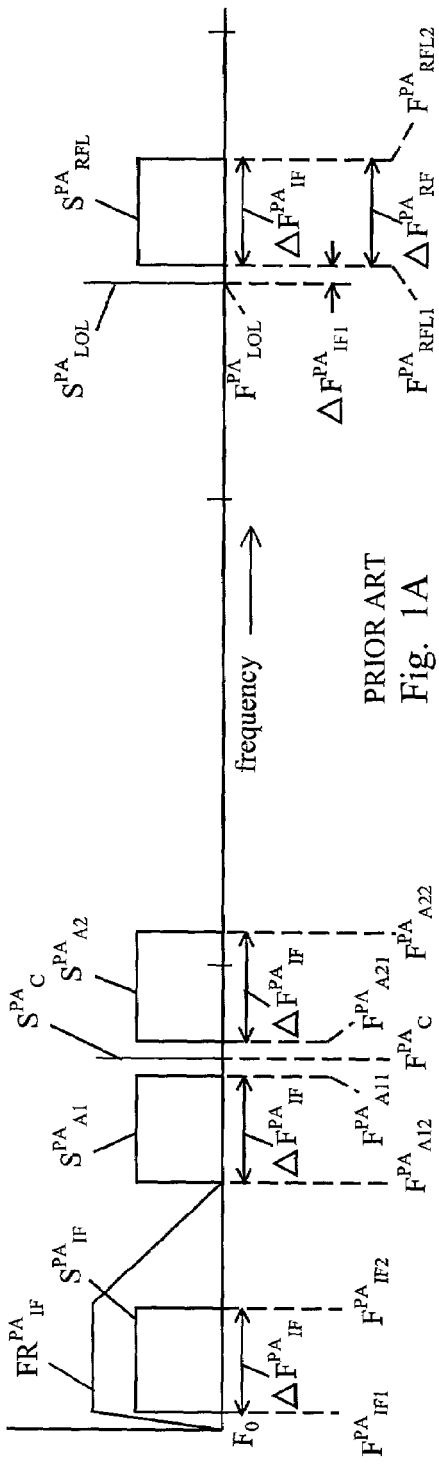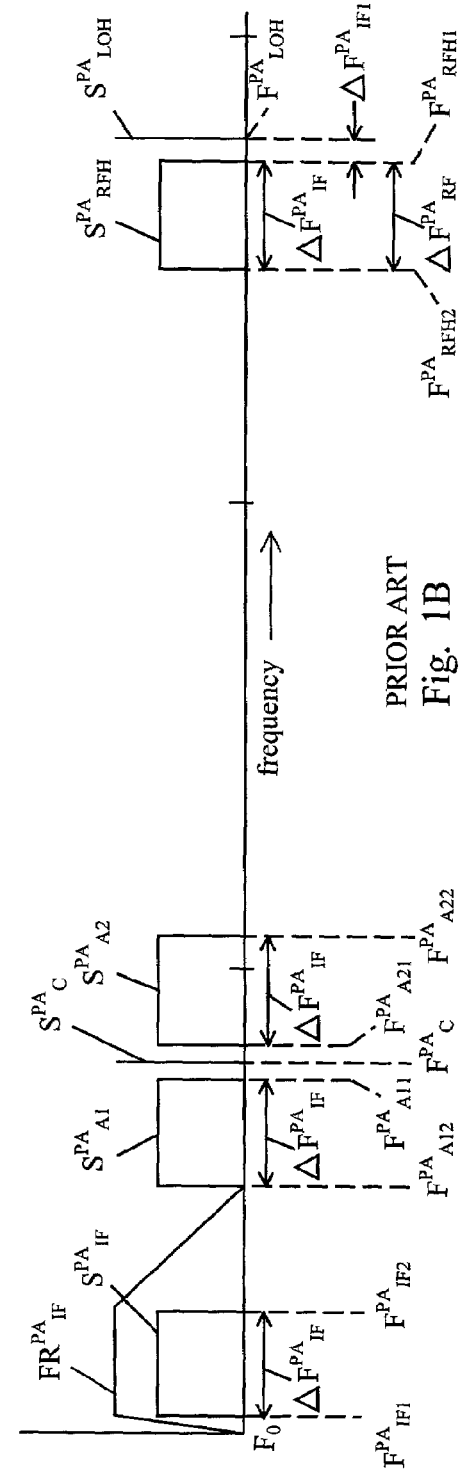
PRIOR ART
Fig. 1A
PRIOR ART
Fig. 1B

TRANSMITTER AND METHOD HAVING A LOW SAMPLING FREQUENCY FOR DIGITAL TO ANALOG CONVERSION

BACKGROUND OF THE INVENTION

1. Field of the Invention

The invention relates generally to signal transmitters more particularly to a transmitter having a method for reducing the frequency of a sampling clock signal used for converting a digital intermediate frequency (IF) signal to an analog IF signal.

2. Description of the Prior Art

Existing transmitters use digital signal processing for generating a digital intermediate frequency (IF) signal and then use a high speed digital to analog converter (DAC) for converting the digital IF signal to an analog IF signal. It is important in such transmitters that the DAC have a linear response so that incremental levels of the digital input signal are converted to consistent incremental levels in the analog output signal throughout the dynamic range of the output signal. A poor linearity causes distortion of the information that is transmitted.

In addition to the analog IF signal, the DAC also issues unwanted sets of IF analog signals, termed alias signals, as sidebands about a frequency that is used by the DAC for sampling the digital IF input signal. These IF alias signals must be suppressed in order to meet regulations by the Federal Communications Commission (FCC) in the United States and by other government agencies in other countries.

Existing transmitters use a radio frequency (RF) filter for suppressing alias signals. This approach has the advantage that hardware for the RF filter is probably required in any case in order to suppress feed through of a local signal (RFLO) used for upconverting the IF signal to an RF transmit signal. However, it may be difficult and expensive to produce an RF filter that suppresses the alias signals sufficiently to achieve the low spurious signal levels required by regulations.

Another approach used by existing transmitters is to increase the sampling frequency of the DAC in order to obtain a large frequency separation between the highest frequency in the desired IF signal and the lowest frequency in the undesired alias signal. Having a larger frequency separation, the alias signal can be more easily suppressed by an IF filter that passes the IF signal. Unfortunately, as the sampling frequency is increased it becomes more difficult and expensive to achieve good linearity in the DAC.

FIGS. 1A–B are frequency charts showing low side and high side frequency upconversion, respectively, for first and second transmitters of the prior art. The horizontal axes on the charts represent frequency and the vertical axes show the presence of signals. Zero frequency or DC is shown as a frequency $F_0$. A sampling clock signal $S^{PA}_C$ having a clock frequency $F^{PA}_C$ is used in a DAC for converting a digital representation of an intermediate frequency (IF) signal to an analog IF signal $S^{PA}_{IF}$ having IF channel frequencies corresponding to RF transmission channel frequencies.

The IF signal $S^{PA}_{IF}$ has an IF frequency band $\Delta F^{PA}_{IF}$ between a lower IF frequency $F^{PA}_{IF1}$ and an upper IF frequency $F^{PA}_{IF2}$. The DAC also issues undesired alias signals having alias frequencies symmetrical about the clock frequency $F^{PA}_C$ and harmonics of the clock frequency $F^{PA}_C$. The pairs of alias signals are frequency images and negative frequency images of the IF signal $S^{PA}_{IF}$.

Exemplary alias signals $S^{PA}_{A2}$ and $S^{PA}_{A1}$ about the fundamental of the clock frequency $F^{PA}_C$ have alias frequencies from a lower sum alias frequency $F^{PA}_{A21}$ to an upper sum alias frequency $F^{PA}_{22}$ and an upper difference alias frequency $F^{PA}_{A11}$ to a lower difference alias frequency $F^{PA}_{A12}$, respectively, where the frequency difference between $F^{PA}_C$ and $F^{PA}_{21}$ equals $F^{PA}_{IF1}$, the frequency difference between $F^{PA}_C$ and $F^{PA}_{A22}$ equals $F^{PA}_{IF2}$, the frequency difference between $F^{PA}_C$ and $F^{PA}_{A11}$ equals the negative of $F^{PA}_{IF1}$, and the frequency difference between $F^{PA}_C$ and $F^{PA}_{A12}$ equals the negative of $F^{PA}_{IF2}$. It should be noted that the alias signals $S^{PA}_{A1}$ and $S^{PA}_{A2}$ each have a frequency band equal in width to the IF frequency band $\Delta F^{PA}_{IF}$.

Referring to FIG. 1A an RF local oscillator (LO) signal $S^{PA}_{LOL}$ having an RF local oscillator (LO) frequency $F^{PA}_{LOL}$ is used for upconverting the IF signal $S^{PA}_{IF}$ to an RF transmit signal $S^{PA}_{RFL}$ having an RF frequency band $\Delta F^{PA}_{RF}$ from an RF frequency $F^{PA}_{RFL1}$ corresponding to the IF frequency $F^{PA}_{IF1}$ to an RF frequency $F^{PA}_{RFL2}$ corresponding to the IF frequency $F^{PA}_{IF2}$. In order to suppress feedthrough of the RFLO signal $S^{PA}_{LOL}$ in a single stage upconversion of the IF signal $S^{PA}_{IF1}$ the RFLO frequency $F^{PA}_{LOL}$ is separated from the RF frequency $F^{PA}_{RFL1}$ by a frequency width $\Delta F^{PA}_{IF1}$, equal to the frequency $F^{PA}_{IF1}$.

Referring to FIG. 1B an RFLO signal $S^{PA}_{LOH}$ having an RF LO frequency $F^{PA}_{LOH}$ is used for upconverting the IF signal $S^{PA}_{IF}$ to an RF transmit signal $S^{PA}_{RFH}$ having the same RF frequency band $\Delta F^{PA}_{RF}$ from an RF frequency $F^{PA}_{RFH1}$ corresponding to the negative of the IF frequency $F^{PA}_{IF1}$ to an RF frequency $F^{PA}_{RFH2}$ corresponding to the negative of the IF frequency $F^{PA}_{IF2}$. In order to suppress feedthrough of the RFLO signal $S^{PA}_{LOH}$ in a single stage upconversion of the IF signal $S^{PA}_{IF}$, the RFLO frequency $F^{PA}_{LOH}$ is separated from the RF frequency $F^{PA}_{RFH1}$ by a frequency width $\Delta F^{PA}_{IF1}$ equal to the negative of the frequency $F^{PA}_{IF1}$.

It should be noted that the RF transmit signals $S^{PA}_{RFL}$ and $S^{PA}_{RFH}$ have frequency bands $\Delta F^{PA}_{RF}$ equal in width to the IF frequency band $\Delta F^{PA}_{IF}$. An IF filter having a frequency response $FR^{PA}_{IF}$ passes the IF signal $S^{PA}_{IF}$ and suppresses the alias signals $S^{PA}_{A1}$ and $S^{PA}_{A2}$ so that the alias signals $S^{PA}_{A1}$ and $S^{PA}_{A2}$ do not contaminate the RF transmit signals $S^{PA}_{RFL}$ and SPA RFH with spurious emissions.

It is desirable to minimize the sampling CLK frequency $F^{PA}_C$ in order to more easily and at lower cost to achieve good linearity in the DAC and other digital processing circuits. In existing transmitters where the IF frequency channels in the IF frequency band $\Delta F^{PA}_{IF}$ are upconverted to the RF frequency channels in the RF frequency band $\Delta F^{PA}_{RF}$, the CLK frequency $F^{PA}_C$ is expressed according to an equation 1 as a function of a frequency ratio R between the lowest alias frequency $F^{PA}_{A12}$ that must be suppressed and the highest IF frequency $F^{PA}_{IF2}$ that must be passed in the IF frequency response $FR^{PA}_{IF}$ of the IF filter ($R = F^{PA}_{A12}/F^{PA}_{IF2}$), the width of the RF frequency band $\Delta F^{PA}_{RF}$, and the lowest IF frequency $F^{PA}_{IF1}$.

$$F^{PA}_C = (\Delta F^{PA}_{RF} + \Delta F^{PA}_{IF1})*(1+R) \tag{1}$$

It can be seen from the equation 1 that the clock frequency $F^{PA}_C$ can be minimized by reducing the frequency ratio R and/or reducing the lowest IF frequency $F^{PA}_{IF1}$. However, for a given technology, after a certain value is reached it is difficult and expensive to achieve the filter response $FR^{PA}_{IF}$ to further reduce the frequency ratio for R. Moreover, filters in integrated circuits using standard integrated circuit technology have relatively soft transitions in the filter response $FR^{PA}_{IF}$ and therefore require a relatively large value for the frequency ratio R. Furthermore, unless additional IF upconversion stages are used, the lowest IF frequency $F^{PA}_{IF1}$ is determined by the frequency separation $\Delta F^{PA}_{IF1}$ that is required in an RF filter for suppressing feedthrough of the RF transmit signal $S^{PA}{}_{RFL}$ or the RF transmit signal $S^{PA}{}_{RFH}$. Unfortunately, these considerations have led practitioners in the art to use a relatively high frequency $F^{PA}{}_C$, thereby increasing the difficulty and cost of achieving sufficient linearity in a high speed DAC and other digital processing circuits.

Different frequency plans have been used to resolve this issue. For example, one of the alias signals can be used as the desired IF signal, or the transmission frequency channels may be first generated at RF instead of IF. However, these alternative frequency plans require the resolution of other problems. There is a need for another method in a transmitter for reducing the sampling frequency for converting a digital IF signal to an analog IF signal while still suppressing IF alias signals.

SUMMARY OF THE INVENTION

It is therefore an object of the present invention to reduce the sampling frequency for converting a digital IF signal to an analog IF signal by using high side and low side upconversion and reusing the IF channel frequencies for upper and lower segments of an RF frequency band, respectively.

Briefly, in a preferred embodiment a transmitter of the present invention includes a digital to analog converter (DAC), an intermediate frequency (IF) filter, a high-low radio frequency local (RFLO) signal generator, and an RF upconverter. The DAC receives a multilevel digital IF signal having IF frequency channels corresponding to RF transmission frequency channels and issues a desired analog IF signal. The DAC also issues undesired IF alias signals. The IF filter passes the analog IF signal and suppresses the alias signals.

The high-low RFLO generator generates an RFLO signal that is controlled to switch between a first (low RF) frequency that is below a desired RF frequency band and a second (high RF) frequency that is above the desired RF frequency band. The RF upconverter uses the low RF frequency for upconverting the IF frequency channels into the RF transmission frequency channels in the lower half of the RF frequency band and uses the high RF frequency for upconverting the same IF frequency channels into the RF transmission frequency channels in the upper half of the RF frequency band.

An advantage of the present invention of the transmitter having the high-low RFLO signal generator is that a lower sampling clock frequency is used for converting a digital IF signal to an analog IF signal.

These and other objects and advantages of the present invention will no doubt become obvious to those of ordinary skill in the art after having read the following detailed description of the preferred embodiments which are illustrated in the various figures.

IN THE DRAWINGS

FIGS. 1A–B are frequency charts showing low side and high side frequency upconversion, respectively, for a transmitter of the prior art;

DETAILED DESCRIPTION OF THE PREFERRED EMBODIMENTS

Figure 1C:
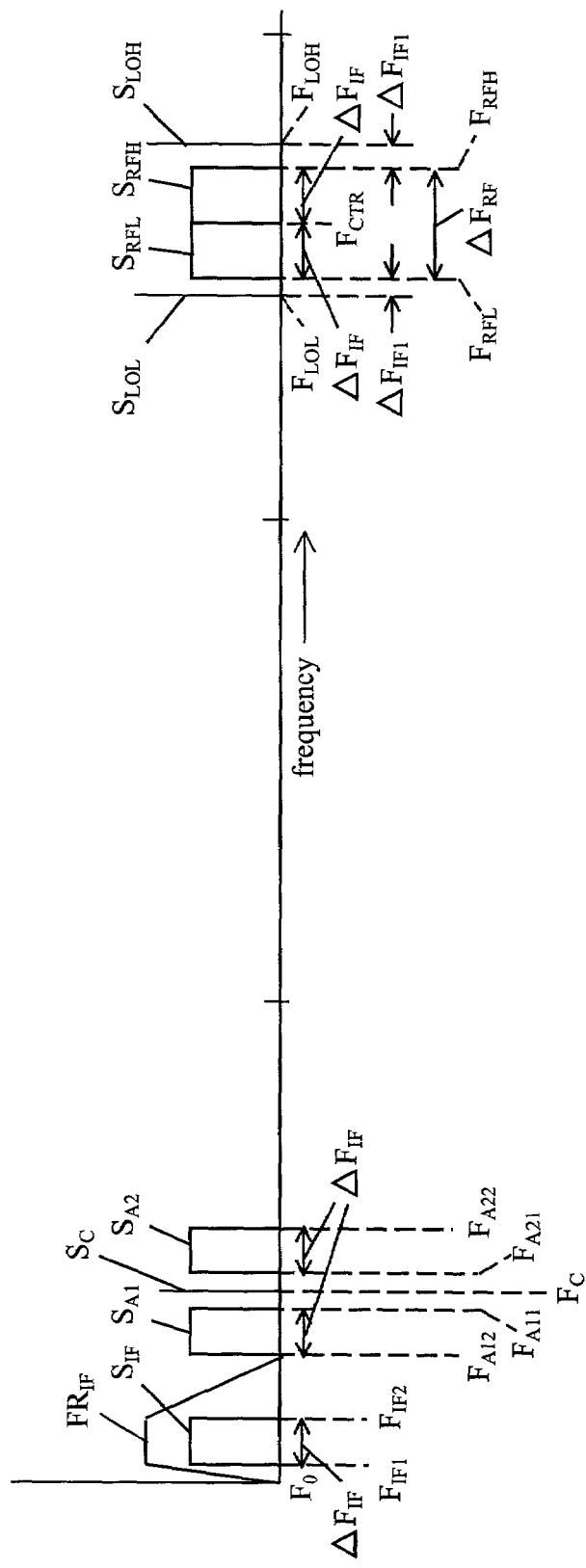
FIG. 1C is a frequency chart for a transmitter of the present invention.

FIG. 1C is a frequency chart for a transmitter 10 of the present invention. The horizontal axis of the chart represents frequency with zero frequency, or DC, at frequency $F_0$ and the vertical axis shows the presence of signals. A detailed description of the manner in which the signals and frequencies are generated is to be found below in the description accompanying FIG. 2A. Briefly, in the FIG. 1C a sampling clock (CLK) signal $S_C$ has a sampling CLK frequency $F_C$. An analog intermediate frequency (IF) signal $S_{IF}$ has an IF frequency band $\Delta F_{IF}$ having IF frequency channels from a lower IF frequency $F_{IF1}$ to an upper IF frequency $F_{IF2}$.

Alias signals $S_{A2}$ and $S_{A1}$ have alias frequencies from a lower sum alias frequency $F_{A21}$ to an upper sum alias frequency $F_{A22}$ and from an upper difference alias frequency $F_{A11}$ to a lower difference alias frequency $F_{A12}$, respectively. The frequency difference between $F_C$ and $F_{A21}$ equals $F_{IF1}$, the frequency difference between $F_C$ and $F_{A22}$ equals $F_{IF2}$, the frequency difference between $F_C$ and $F_{A11}$ equals the negative of $F_{IF1}$, and the frequency difference between $F_C$ and $F_{A12}$ equals the negative of $F_{IF2}$. The alias signals $S_{A1}$ and $S_{A2}$ each have a band equal in width to the IF frequency band $\Delta F_{IF}$.

An IF frequency response $FR_{IF}$ passes the IF signal $S_{IF}$ between the IF frequency $F_{IF1}$ and the IF frequency $F_{IF2}$ and suppresses the alias signals $S_A$ above the alias frequency $S_{A12}$. A radio frequency (RF) local oscillator (LO) signal $S_{LOL}$ has an RF LO frequency $F_{LOL}$; and an RF LO signal $S_{LOH}$ has an RF LO frequency $F_{LOH}$. An RF frequency band $\Delta F_{RF}$ extends from the RF frequency $F_{RFL}$ to the RF frequency $F_{RFH}$. An RF frequency $F_{CTR}$ is a midpoint between the RF frequency $F_{RFL}$ and the RF frequency $F_{RFH}$.

An RF transmit signal $S_{RFL}$ has a frequency band having a width equal to the IF frequency band $\Delta F_{IF}$ in a lower part of the RF frequency band $\Delta F_{RF}$ from the RF frequency $F_{RFL}$ to the RF frequency $F_{CTR}$.

Similarly, an RF transmit signal $S_{RFH}$ has a frequency band having a width equal to the IF frequency band $\Delta F_{IF}$ in an upper part of the RF frequency band $\Delta F_{RF}$ from the RF frequency $F_{RFH}$ to the RF frequency $F_{CTR}$.

The lower RF LO frequency $F_{LOL}$ and the lower RF frequency $F_{RFL}$ have a frequency separation $\Delta F_{IF1}$ equal in width to the lower IF frequency $F_{IF1}$. Similarly, the higher RF LO frequency $F_{LOH}$ and the higher RF frequency $F_{RFH}$ have the frequency separation $\Delta F_{IF1}$ equal in width to the negative of the lower IF frequency $F_{IF1}$. It will be described below that for a given RF frequency band $\Delta F_{RF}$ equal to the prior art RF frequency band $\Delta F^{PA}{}_{RF}$ and a given lower IF frequency $F_{IF1}$ equal to the prior art lower IF frequency $F^{PA}{}_{IF1}$ the CLK frequency $F_C$ of the present invention is lower than the prior art clock frequency $F^{PA}{}_C$.

Figure 2A:
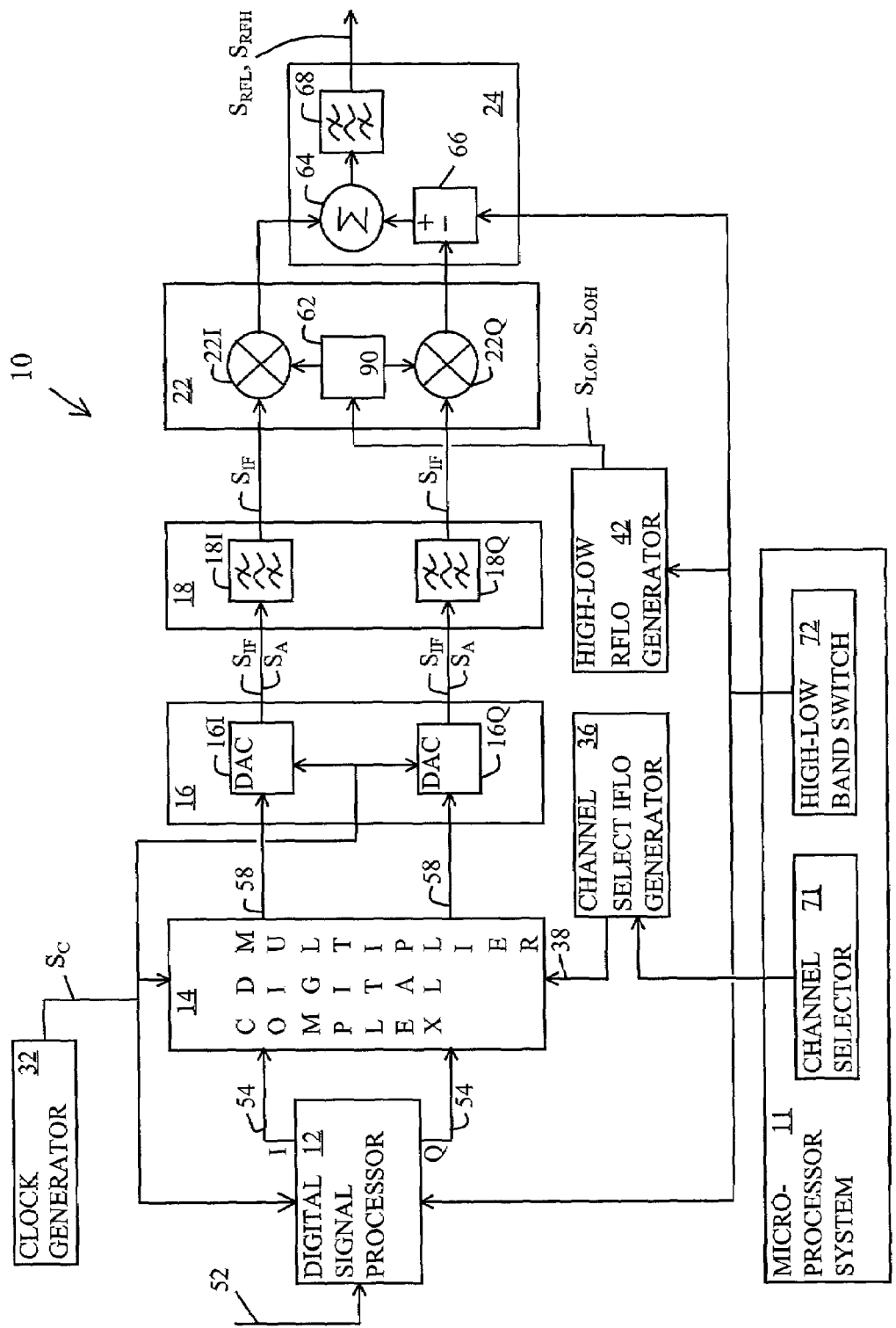
FIGS. 2A and 2B are a block diagrams of a transmitters of the present invention having non-complex and complex upconversion, respectively, using the frequencies illustrated in the frequency chart of FIG. 1C.

FIG. 2A is a block diagram of an embodiment of the transmitter 10 of the present invention referred to by the reference number 10. The transmitter 10 includes a microprocessor system 11, a digital signal processor 12, a digital multiplier 14, a digital to analog converter (DAC) 16, an intermediate frequency (IF) filter 18, a radio frequency (RF) upconverter 22, and an RF output section 24. Preferably, digital signal processor 12, the digital multiplier 14, the DAC 16, the IF filter 18, the RF upconverter 22, and the RF section 24 are complex for processing in-phase (I) and quadrature phase (O) channels.

The transmitter 10 also includes a sampling clock generator 32 for generating the CLK signal $S_C$ at the CLK frequency $F_C$; an IF channel select local oscillator signal (IFLO) generator 36 for generating an IFLO signal 38; and a high-low RF signal (RFLO) generator 42 for generating either the RF LO signal $S_{LOL}$ or the RF LO signal $S_{LOH}$.

The IFLO frequency 38 of the IFLO generator 36 is controlled by the microprocessor system 11 for generating IF channel frequencies for subsequent upconversion to RF transmission frequency channels. The high-low RFLO generator 42 is controlled by the microprocessor system 11 to switch between the RF LO signal $S_{LOL}$ and the RF LO signal $S_{LOH}$ according to whether the current RF transmission frequency channel is in the lower half (below $F_{CTR}$) or upper half (above $F_{CTR}$) of the RF frequency band $\Delta F_{RF}$. The microprocessor system 11 includes a memory for storing variable and fixed data and programmed instructions for directing the operation of the microprocessor system 11 in a convention manner for controlling the operation of the elements of the transmitter 10. It should be understood that amplifiers are required for amplifying the various signals and a power supply is required for powering the elements of the transmitter 10.

The digital signal processor 12 uses the CLK signal SC for interpolating a baseband signal 52 having information to be transmitted and issues in-phase (I) and quadrature phase (O) components of a complex DSP signal 54. The IFLO generator 36 generates an IFLO signal 38 that is controlled by the microprocessor system 11 to shift frequency according to the transmit frequency channel of the RF transmit signals $S_{RFL}$ and $S_{RFH}$ in which the transmit information is to be transmitted. The digital multiplier 14 uses the IFLO signal 38 for converting the I and Q components of the DSP signal 54 to I and Q components of a digital IF signal 58 having a digital IF carrier frequency that changes or hops according to IF channel frequencies. Circuits within the digital multiplier 14 are synchronized according to the CLK signal $S_C$.

The DAC 16 includes an I DAC 16I and a Q DAC 16Q for using the CLK signal $S_C$ for converting the second digital IF signal to I and Q components of the desired analog IF signal $S_{IF}$ and undesired alias signals $S_A$. The analog IF signal $S_{IF}$ has an IF carrier frequency in the frequency band $\Delta F_{IF}$ between the IF frequency $F_{IF1}$ and the IF frequency $F_{IF2}$.

As described above, the undesired alias signals $S_A$ have frequency ranges that are images and negative images of the frequency range $F_{IF1}$ to $F_{IF2}$ of the IF signal $S_{IF}$ and appear in pairs having alias frequencies symmetrical about the CLK frequency $F_C$ and about harmonics of the CLK frequency $F_C$. The exemplary alias signals $S_{A2}$ and $S_{A1}$ have the alias frequencies $F_{A21}$ to $F_{A22}$ and $F_{A11}$ to $F_{A12}$, respectively, as described above. The IF filter 18 includes an I IF filter 18I and a Q IF filter 18Q having frequency response $FR_{IF}$ for passing I and Q components of the analog IF signal $S_{IF}$ and suppressing the alias signals $S_A$. In the frequency response of the IF filter $FR_{IF}$ cuts off for suppressing the alias signal $S_{A2}$ and the alias signal $S_{A1}$ is suppressed by the quadrature balance of the upconversion in the receive 10.

The RF upconverter 22 includes an I mixer 22I, a Q mixer 22Q, and a 90 degree phase splitter 62. The 90 degree phase splitter 62 receives either the RF LO signal $S_{LOL}$ or the RF LO signal $S_{LOH}$ and issues an I component to the I mixer 22I and a Q component to the Q mixer 22Q. The I mixer 22I uses the I component of the RF LO signal $S_{LOL}$ or the RF LO signal $S_{LOH}$ and issues an I RF signal to the RF section 24.

Similarly, the Q mixer 22Q uses the Q component of the RF LO signal $S_{LOL}$ or the RF LO signal $S_{LOH}$ and issues a Q RF signal to the RF section 24.

The RF section 24 includes a summer 64, a selectable inverter 66, and an RF filter 68. The summer 64 sums the I RF signal received at a first input with the Q RF signal received through the inverter 66 at a second input and issues a summed RF signal to the RF filter 68. The RF filter 68 passes the summed RF signal and suppresses feedthrough of the RF LO signal $S_{LOL}$ or the RF LO signal $S_{LOH}$ for issuing the RF transmit signal $S_{RFL}$ or the RF transmit signal $S_{RFH}$, respectively. The lower IF frequency $F_{IF1}$ is preferably determined by the frequency separation $\Delta F_{IF1}$ between the RFLO frequency $F_{LOL}$ or $F_{LOH}$ and the RF transmit frequency $F_{RFL}$ or $F_{RFH}$, respectively, that is required by the RF filter 68 for suppressing the feedthrough RFLO signal $S_{LOL}$ or $S_{LOH}$.

The RF filter 68 may also act in combination with the IF filter 18 for suppressing upconverted representations of the alias signals $S_A$. When the transmitter 10 is coupled with a receiver for forming a transceiver, the RF filter 68 may be embodied in a diplexer. The inverter 66 is controlled by the microprocessor system 11 for inverting or non-inverting the Q RF signal in coordination with the control of the high-low selection for one of the RF LO signal $S_{LOL}$ and the RF LO signal $S_{LOH}$ from the high-low RFLO generator 42. It should be understood that the selectable inverter 66 may be disposed for selectably inverting the Q signal in either the RF or IF signal path, or pushed through the summer 64 for selectably inverting the summed RF signal and the I signal in either the RF or IF signal path.

The transmitter 10 transmits the RF transmit signals $S_{RFL}$ and $S_{RFH}$ in a regulated transmit frequency band $\Delta F_{RF}$ from the RF frequency $F_{RFL}$ to the RF frequency $F_{RFH}$. The RF transmit signals $S_{RFL}$ and $S_{RFH}$ are transmitted in frequency channels or subchannels of the transmit frequency band $\Delta F_{RF}$. The RF output may change or hop between the lower ($F_{RFL}$ to $F_{CTR}$) and upper ($F_{RFH}$ to $F_{CTR}$) halves of the transmit frequency band $\Delta F_{RF}$ and between channels or subchannels within the lower and upper halves of the transmit frequency band $\Delta F_{RF}$ but at any one time the RF transmit signal $S_{RFL}$ or $S_{RFH}$ is transmitted in a single channel or subchannel. In addition to the transmission frequency channels, the RF transmit signals $S_{RFL}$ and $S_{RFH}$ may be transmitted in time channels or slots of a time division multiple access (TDMA) communication plan.

The memory in the microprocessor system 11 includes programmed instructions for a channel selector 71 for controlling the frequency of the IFLO signal 38 according to the current desired frequency channel and programmed instructions for a high-low band switch 72. The high-low band switch 72 directs the high-low RFLO generator 42 to switch to the RF LO signal $S_{LOL}$ for channels in the low band ($F_{RFL}$ to $F_{CTR}$) and the RF LO signal $S_{LOH}$ for channels in the high band ($F_{RFH}$ to $F_{CTR}$). The high-low band switch 72 also directs the inverter 66 to switch between non-invert and invert and directs the digital signal processor 12 to compensate for spectral inversion in the upconversion between the low and high bands. The use of the RF center frequency $F_{CTR}$ to separate high and low bands results in an IF frequency band $\Delta F_{IF}$ of one-half the transmit frequency band $\Delta F_{RF}$, thereby enabling a lower sampling CLK frequency $F_C$ to be used by the digital signal generator 12 and the DAC 16.

It is desirable to minimize the sampling CLK frequency $F_c$ used in the DAC 18 and the digital signal processor 12. The CLK frequency $F_C$ is expressed in an equation 2 as the sum one-half times the width of the RF frequency band $\Delta F_{RF}$ plus the lowest IF frequency $F_{IF1}$ times the sum of one plus the frequency ratio $R=F_{A12}/F_{IF2}$ between the lowest alias frequency $F_{A12}$ that must be suppressed and the highest IF frequency $F_{IF2}$ that must be passed in the IF frequency response $FR_{IF}$ of the IF filter 18.

$$F_C=(\tfrac{1}{2}*\Delta F_{RF}+F_{IF1})*(1+R) \qquad (2$$

It will be noted that the equation 2 for the present invention differs from the equation 1 for the prior art by relating the sampling CLK frequency $F_C$ to one-half times the width of the RF frequency band $\Delta F_{RF}$ in contrast to one times the width of the RF frequency band $\Delta F^{PA}{}_{RF}$ for the sampling CLK frequency $F^{PA}{}_C$ of the prior art transmitter. Because the RF frequency bands $\Delta F_{RF}$ and $\Delta F^{PA}{}_{RF}$ are likely to be set by regulations, the present invention has the benefit of having a substantially lower sampling CLK frequency $F_C$ than the sampling CLK frequency $F^{PA}{}_C$ of the prior art. Some of the benefit of the present invention is obtained when the CLK frequency $F_C$ is related to a fraction, such as $\tfrac{6}{10}$, $\tfrac{7}{10}$, $\tfrac{8}{10}$, and $\tfrac{9}{10}$, of the width of RF frequency band between one-half and one.

It is known by those of ordinary skill in the art that the complex upconversion as described above for the transmitter 10 suppresses the alias difference signal $S_{A1}$ to a degree that is determined by the gain balance and quadrature phase between the I and Q signal paths. In a preferred embodiment, the transmitter 10 of the present invention achieves additional suppression of the alias difference signal $S_{A1}$ while minimizing the sampling frequency $F_C$ as shown in the equation 2. In an alternative embodiment, the transmitter 10 depends upon the balance and phase of the I and Q signal paths for suppressing the alias difference frequencies $F_{A12}$ to $F_{A11}$. In this embodiment, the frequency ratio R in the equations 1 and 2 is the ratio $F_{A21}/F_{IF2}$ of the lower sum alias frequency $F_{A21}$ and the upper IF frequency $F_{IF2}$. In another embodiment the frequency ratio R in the equations 1 and 2 is the ratio $F_C/F_{IF2}$.

In a numerical example, the width of the RF frequency band $\Delta F_{RF}$ and $\Delta F^{PA}{}_{RF}$ is 186 MHz; the IF frequency $F_{IF1}$ and $F^{PA}{}_{IF1}$ is 30 MHz; and the frequency ratio R is 2.25 for the frequency response $FR_{IF}$ for $R=F_{A12}/F_{IF2}$ and the frequency response $FR^{PA}{}_{IF}$ for $R=F_{A12}/F^{PA}{}_{IF2}$ For the transmitter 10 of present invention, the CLK signal $S_C$ has a CLK frequency $F_C$ of 400 MHz according to the equation 2. For a prior art transmitter the CLK signal $S^{PA}{}_C$ has a CLK frequency $F^{PA}{}_C$ of 702 MHz according to the equation 1. In this numerical example the sampling clock frequency is approximately 57% of the sampling clock frequency of the prior art.

Figure 2B:
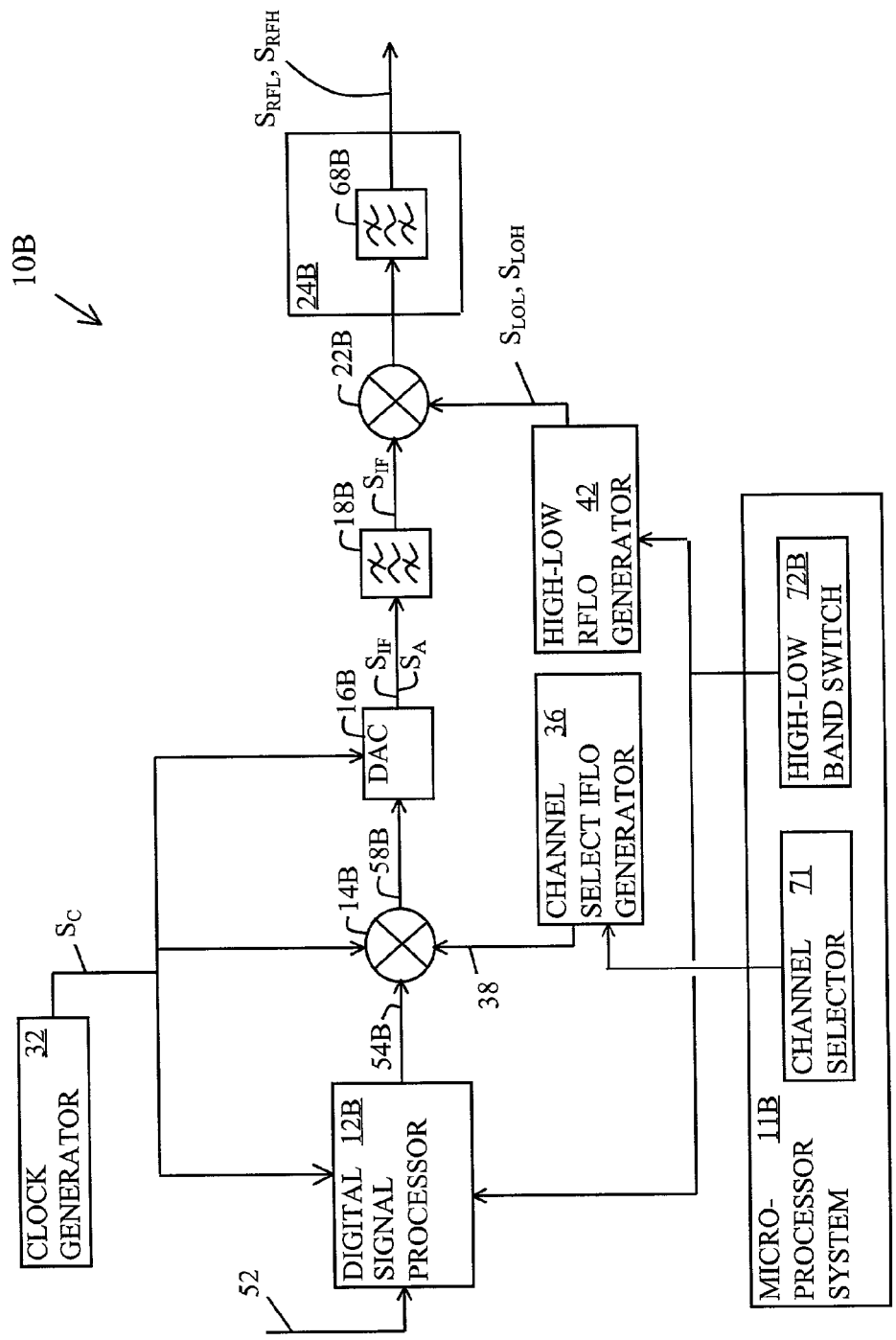

FIG. 2B is a block diagram of an embodiment of the transmitter 10 of the present invention referred to by the reference number 10B. The transmitter 10B differs from the transmitter 10 in that the transmitter 10B uses non-complex upconversion.

The transmitter 10B includes a microprocessor system 11B and non-complex variations of the upconversion elements of the transmitter 10. In other words the transmitter 10B includes a non-complex digital signal processor 12B; a non-complex digital multiplier 14B; a non-complex DAC 16B; a non-complex IF filter 18B; a non-complex RF upconverter 22B; and a non-complex RF output section 24B all operating in a manner that is analogous to the complex digital signal processor 12; the complex digital multiplier 14; the complex DAC 16; the complex IF filter 18; the complex RF upconverter 22; and the complex RF output section 24, respectively. It should be understood that amplifiers are required for amplifying the various signals and a power supply is required for powering the elements of the transmitter 10B.

The transmitter 10B also includes the sampling clock generator 32 for generating the CLK signal $S_C$ at the CLK frequency $F_C$; the IF channel select local oscillator signal (IFLO) generator 36 for generating the IFLO signal 38; and the high-low RF signal (RFLO) generator 42 for generating either the RF LO signal $S_{LOL}$ or the RF LO signal $S_{LOH}$ as described above. The DSP signal 54B and the digital IF signal 58B are analogous to the DSP signal 54 and digital IF signal 58 as shown in FIG. 2A and described in the accompanying detailed description for the I channel of the transmitter 10. The IF signal $S_{IF}$ and the alias signals $S_A$ are as shown in FIGS. 1C and 2A described in the respective accompanying detailed descriptions for the I channel of the transmitter 10. The signals $S_{LOL}$, $S_{LOH}$ $S_{RFL}$, and $S_{RFH}$ are as shown in FIGS. 1C and 2A and described in the accompanying detailed descriptions.

The RF section 24B includes an RF filter 68B. The microprocessor system 11B includes the channel selector 71 for controlling the IF channel and a high-low band switch 72B for controlling the digital signal processor 12B for compensating for spectral inversion in coordination with the control of the high-low selection for one of the RF LO signal $S_{LOL}$ and the RF LO signal $S_{LOH}$ from the high-low RFLO generator 42.

Figure 3:
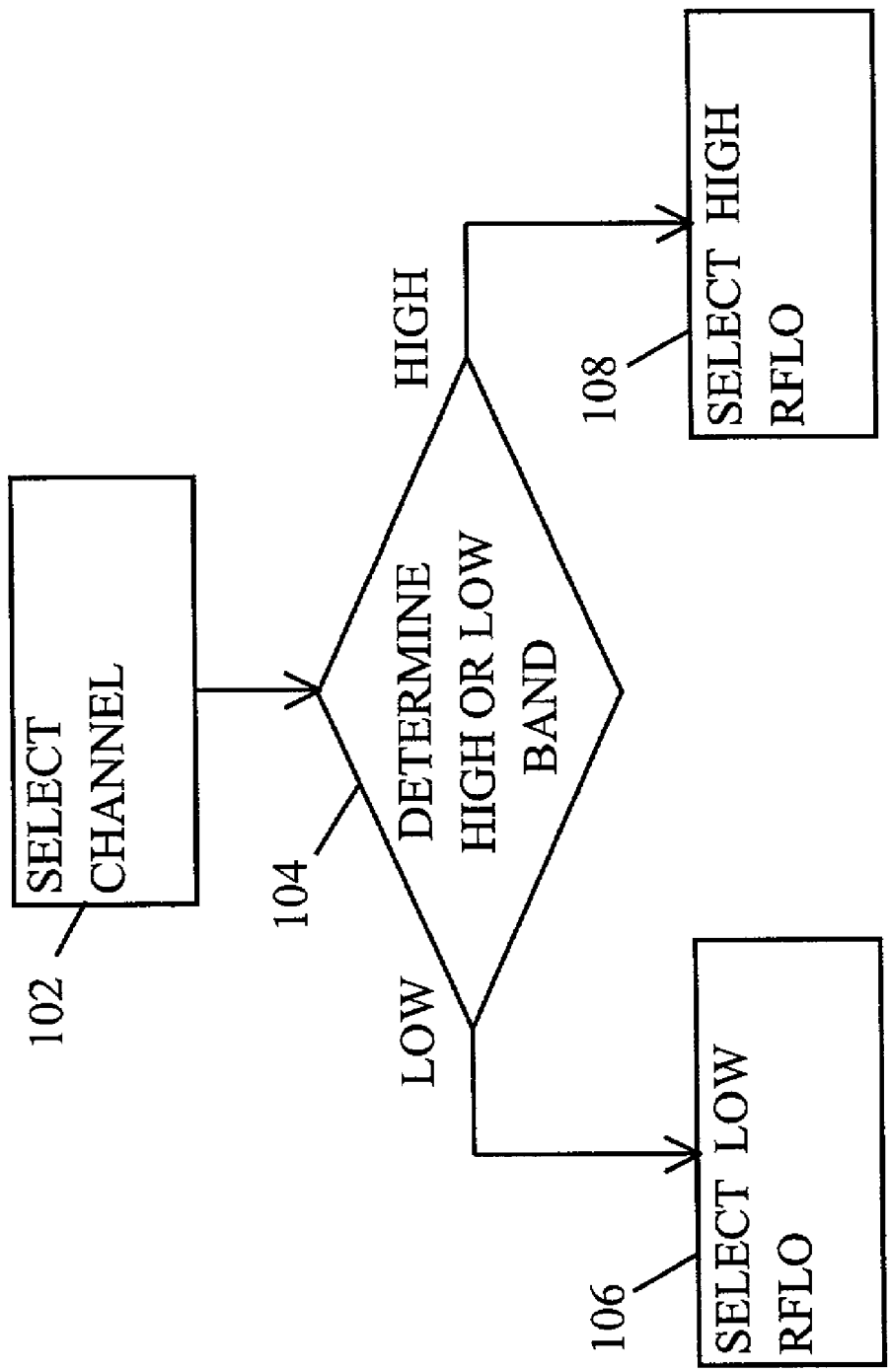
FIG. 3 is a flow chart of a method for the transmitter of FIGS. 2A–B.

FIG. 3 is a method of the present invention for transmitting RF transmit signals $S_{RFL}$ and $S_{RFH}$ in a transmit frequency band $\Delta F_{RF}$ between the RF frequency $F_{RFL}$ and the RF frequency $F_{RFH}$. In a step 102 a transmit frequency channel is selected within the transmit frequency band $\Delta F_{RF}$. In a step 104 it is determined whether the transmit frequency channel is in the low band between the low RF frequency $F_{RFL}$ and the RF center frequency $F_{CTR}$ or in the high band between the RF frequency $F_{RFH}$ and the high RF center frequency $F_{CTR}$. In a step 106 when the transmit frequency channel is in the low band, the RF LO signal $S_{LOL}$ is generated for converting the IF signal $S_{IF}$ to the RF transmit signal $S_{RFL}$. In a step 108 when the transmit frequency channel is in the high band, the RF LO signal $S_{LOH}$ is generated for converting the IF signal $S_{IF}$ to the RF transmit signal $S_{RFH}$.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A transmitter for transmitting a transmit signal having a transmit frequency within a transmit frequency band, comprising:

a high-low signal generator for generating an LO signal having an LO frequency lower than said transmit frequency band when said transmit frequency is in a lower part of said transmit frequency band and an LO frequency greater than said transmit frequency when said transmit frequency is in an upper part of said transmit frequency band;

an upconverter for using said LO signal for frequency upconverting an intermediate frequency (IF) signal to said transmit signal; and a digital to analog converter (DAC) using a sampling clock signal having a sampling clock frequency for converting a digital signal to said IF signal, said IF signal having an IF frequency band having IF channel frequencies corresponding to transmit channel frequencies in said lower part of said transmit frequency band and having the same said IF channel frequencies corresponding to different transmit channel frequencies in said upper part of said transmit frequency band; wherein:

said sampling frequency is about equal to a sum of a fraction of the width of said transmit frequency band plus a lower IF frequency times a sum of one plus a ratio of an alias frequency to an upper IF frequency, said lower IF frequency and said upper IF frequency bounding said IF frequency band and said alias frequency at said sampling clock frequency minus said upper IF frequency.

2. The transmitter of claim 1, wherein:
said fraction is at least one-half and less than one.

3. The transmitter of claim 1, wherein:
said fraction is about one-half.

4. The transmitter of claim 1, further comprising:
a digital signal processor for receiving transmit information and issuing a DSP signal carrying said transmit information;
a channel select IFLO generator for generating an IFLO signal having an IFLO frequency controlled according to a desired one of said transmit channel frequencies;
a digital multiplier using said IFLO signal for converting said DSP signal to said digital signal; and
an IF filter coupled to the DAC for passing said IF signal to said upconverter and suppressing said alias signal.

5. A method for transmitting a transmit signal having a transmit frequency within a transmit frequency band, comprising:
generating an LO signal having an LO frequency lower than said transmit frequency band when said transmit frequency is in a lower part of said transmit frequency band and an LO frequency greater than said transmit frequency when said transmit frequency is in an upper part of said transmit frequency band;
using said LO signal for frequency upconverting an intermediate frequency (IF) signal to said transmit signal; and
converting a digital signal to said IF signal using a sampling clock signal having a sampling clock frequency, said IF signal having an IF frequency band having IF channel frequencies corresponding to transmit channel frequencies in said lower part of said transmit frequency band and having the same said IF channel frequencies corresponding to different transmit channel frequencies in said upper part of said transmit frequency band; wherein:

said sampling frequency is about equal to a sum of a fraction of the width of said transmit frequency band plus a lower IF frequency times a sum of one plus a ratio of an alias frequency to an upper IF frequency, said lower IF frequency and said upper IF frequency bounding said IF frequency band and said alias frequency at said sampling clock frequency minus said upper IF frequency.

6. The method of claim 5 wherein:
said fraction is at least one-half and less than one.

7. The method of claim 5, wherein:
said fraction is about one-half.

8. The method of claims 5 further comprising:
generating a DSP signal carrying transmit information;
generating an IFLO signal having an IFLO frequency controlled according to a desired one of said transmit channel frequencies;
using said IFLO signal for converting said DSP signal to said digital signal; and
passing said IF signal for upconversion by said LO signal while suppressing said alias signal.

* * * * *